(12) United States Patent
Jernakoff et al.

(10) Patent No.: US 6,743,267 B2
(45) Date of Patent: Jun. 1, 2004

(54) GEL-FREE COLLOIDAL ABRASIVE POLISHING COMPOSITIONS AND ASSOCIATED METHODS

(75) Inventors: Peter Jernakoff, Wilmington, DE (US); Junaid Ahmed Siddiqui, Richmond, VA (US)

(73) Assignee: DuPont Air Products Nanomaterials LLC, Carlsbad, CA (US)

( * ) Notice: Subject to any disclaimer, the term of this patent is extended or adjusted under 35 U.S.C. 154(b) by 30 days.

(21) Appl. No.: 10/245,440

(22) Filed: Sep. 17, 2002

(65) Prior Publication Data

US 2003/0114083 A1 Jun. 19, 2003

Related U.S. Application Data

(60) Provisional application No. 60/329,482, filed on Oct. 15, 2001.

(51) Int. Cl.[7] .......................... C09G 1/02; C09G 1/04; B24B 1/00
(52) U.S. Cl. .......................... 51/307; 51/308; 51/309; 106/3; 252/79.1; 252/79.2; 438/692; 438/693; 216/89; 451/28
(58) Field of Search ....................... 51/307–309; 106/3; 252/79.1, 79.2; 438/692, 693; 216/89; 451/28

(56) References Cited

U.S. PATENT DOCUMENTS

| | | |
|---|---|---|
| 2,630,410 A | 3/1953 | Clapsadle et al. .......... 252/313 |
| 3,252,917 A | 5/1966 | Mindick et al. ............ 252/313 |
| 3,620,978 A | 11/1971 | Moore, Jr. ................. 252/313 |
| 3,745,126 A | 7/1973 | Moore, Jr. ................. 252/313 |
| 6,238,272 B1 | 5/2001 | Tanaka et al. .............. 451/41 |

FOREIGN PATENT DOCUMENTS

EP 1000995 5/2000 ............ C09K/3/14

OTHER PUBLICATIONS

"The Chemistry of Silica," R.K. Iler, Wiley Interscience (1979) pp. 410–411, (no month).
"Polishing Surfaces for Integrated Circuits," B.L. Mueller, et al, Chemtech, Feb. 1998, pp. 38–46.
"Thin Solids Films," H. Landis, et al, 220 (1992) p. 1, (no month).

*Primary Examiner*—Michael Marcheschi
(74) *Attorney, Agent, or Firm*—Geoffrey L. Chase

(57) ABSTRACT

Gel-free colloidal abrasive polishing compositions and associated methods for polishing (e.g., chemical mechanical polishing) are described. These abrasive polishing compositions are comprised of a surface-modified colloidal abrasive that has been modified with a boron-containing compound(s), such as boron surface-modified colloidal ceria or silica. These compositions are useful in chemical mechanical planarization (CMP) applications as well as in substrate polishing applications. These abrasive compositions are most often negatively-charged colloids, which remain as stable negatively-charged colloids even in acidic media.

13 Claims, No Drawings

US 6,743,267 B2

GEL-FREE COLLOIDAL ABRASIVE POLISHING COMPOSITIONS AND ASSOCIATED METHODS

CROSS REFERENCE TO RELATED APPLICATIONS

This application is a continuation-in-part to U.S. Provisional Patent Application Serial No. 60/329,482 filed Oct. 15, 2001.

BACKGROUND OF THE INVENTION

The present invention pertains to surface-modified colloidal abrasive (e.g., ceria) polishing compositions (and associated methods using these compositions) wherein the modified colloidal abrasives are negatively-charged colloids (with the exception of modified colloidal titania, which is a positively-charged colloid), which remain negatively-charged in acidic media, and which are gel-free. These compositions are especially useful for chemical mechanical planarization (chemical mechanical polishing, CMP).

Certain modifications of colloidal abrasive compositions are known. Colloidal silica, for example, has been modified with various metallic compounds as disclosed in U.S. Pat. Nos. 3,252,917, 3,745,126, and 3,620,978; EP Patent Publication 1 000 995 A1; and also in the book entitled "The Chemistry of Silica", R. K. Iler, Wiley Interscience (1979), pages 410–411. Colloidal silica has been stabilized with boric acid as disclosed in U.S. Pat. No. 2,630,410.

BRIEF SUMMARY OF THE INVENTION

The invention in one embodiment is a composition for chemical-mechanical planarization comprising:
  a) a boron surface-modified colloidal abrasive containing a boron compound on the surface of the abrasive, wherein the boron compound is present on the surface of the abrasive at a level of at least 20 percent of available surface sites; and
  b) an acid.

The invention in another embodiment is a composition for chemical-mechanical planarization comprising:
  a) a boron surface-modified colloidal abrasive containing a boron compound on the surface of the abrasive, wherein the abrasive is selected from the group consisting of colloidal ceria and colloidal titania; and
  b) an acid.

The invention in still another embodiment is a method of chemical-mechanical planarization comprising the steps of:
  A) placing a substrate in contact with a polishing pad;
  B) delivering a composition comprising:
    a) a boron surface-modified colloidal abrasive containing a boron compound on the surface of the abrasive, wherein the boron compound is present on the surface of the abrasive at a level of at least 20 percent of available surface sites; and
    b) an acid; and
  C) at least partially planarizing the substrate with the composition.

The invention in still another embodiment is a method of chemical-mechanical planarization comprising the steps of:
  A) placing a substrate in contact with a polishing pad;
  B) delivering a composition comprising:
    a) a boron surface-modified colloidal abrasive containing a boron compound on the surface of the abrasive, wherein the abrasive is selected from the group consisting of colloidal ceria and colloidal titania; and
    b) an acid; and
  C) at least partially planarizing the substrate with the composition.

The CMP methods of this invention are especially useful in planarizing various substrates utilized in semiconductor manufacture.

While certain metal modifications of various colloidal abrasives are known as disclosed in the aforementioned references, none of these references though discloses that boron surface-modified colloidal abrasives, such as boron surface-modified colloidal silica, being negatively charged and maintaining their charges even in acidic media as well as the gel-free and floc-free advantages of these boron surface-modified colloidal abrasives. In addition to the floc-free properties, boron surface-modified colloidal silica is stable under acidic as well as basic conditions over a broad pH range from pH=1.5 to pH=9.

DETAILED DESCRIPTION OF THE INVENTION

This invention entails gel-free surface-modified colloidal abrasive polishing compositions and associated processes utilizing these modified abrasive polishing compositions. The gel-free abrasive compositions of this invention are useful not only for polishing base materials (e.g., bare silicon wafers) but also these compositions are especially useful for chemical mechanical planarization (CMP, chemical mechanical polishing) of layers in fabricating semiconductor chips/devices. CMP is now widely known to those skilled in the art and has been described in numerous patents and open literature publications. Some introductory references on CMP are as follows: "Polishing Surfaces for Integrated Circuits", by B. L. Mueller and J. S. Steckenrider, Chemtech, February, 1998, pages 38–46; and H. Landis et al., Thin Solids Films, 220 (1992), page,1. A preferred use of the modified abrasive polishing compositions of this invention is for CMP.

The modified abrasive polishing compositions of this invention comprise a boron surface-modified colloidal abrasive particle. Gel-free colloidal abrasives useful as components in the polishing compositions of this invention include, but are not limited to, colloidal silica, colloidal ceria, and colloidal titania.

A boron surface-modified colloidal abrasive particle is obtained by treatment of a colloidal abrasive particle with a boron-containing compound as detailed infra. Suitable boron-containing compounds to effect boron surface-modification include, but are not limited to, boric acid, boron trichloride, boron trifluoride, and trialkoxy borane. Boric acid is preferred.

A given boron surface-modified colloidal abrasive particle in a composition of this invention has at least 20% of sites on the surface of the colloidal abrasive particle covered by the boron-containing compound and/or other boron-containing compound(s) derived from the boron-containing compound. Preferably, a given boron surface-modified colloidal abrasive particle in a composition of this invention has from about 40% to about 95% of surface sites of the colloidal abrasive particle at least covered by the boron-containing compound and/or other boron-containing compound(s) derived from the boron-containing compound. More preferably, this range of surface coverage on the surface-modified colloidal abrasive particle is from about 80% to about 95%. The percentage of surface sites covered on a colloidal abrasive particle in a composition of this invention can range up to 100%.

Some embodiments of this invention are compositions for chemical-mechanical planarization that comprise a) a colloidal abrasive whose surface has been modified to contain a) a boron-containing compound and/or other boron-containing compound(s) derived from the boron-containing compound and b) an acid. Suitable boron surface-modified colloidal abrasives include, but are not limited to, boron surface-modified colloidal silica, boron surface-modified colloidal ceria, and boron surface-modified colloidal titania. Boron-modified colloidal silica is preferred in the CMP method embodiments of this invention. Other details (e.g., suitable boron-containing compound(s) and percentage of sites on the colloidal abrasive particle by the boron-containing compound(s)) are as given supra.

Suitable acid components for these compositions include, but are not limited to, sulfuric acid, hydrochloric acid, nitric acid, hydrofluoric acid, phosphoric acid, periodic acid, and organic acid(s). Inorganic acids are preferred. For use in metal chemical mechanical planarization (CMP) applications, oxidizing acids (e.g., periodic acid) are preferred. The compositions of this invention can contain one or more acids, which in the latter case, independently can be either oxidizing acids or non-oxidizing acids.

The compositions of this invention can further comprise an oxidizing agent. Suitable oxidizing agents include, but are not limited to, periodic acid, hydrogen peroxide, and sodium iodate. Periodic acid is a preferred oxidizing agent especially when the acid component is chosen to be a non-oxidizing acid (e.g., sulfuric acid).

The amount of surface-modification of the colloidal abrasive with a boron-containing compound(s) according to this invention in order to insure a gel-free composition depends upon the average size of the colloidal abrasive particles. Colloidal abrasive particles that are smaller and which consequently have less surface area generally require higher levels of surface modification than do larger particles, which have more surface area. As an illustrative example for boric acid surface-modified colloidal silica, the various sizes of colloidal particles required the approximate levels of boric acid modification as shown below in order to achieve good stability towards gel formation in acidic media, such as metal CMP polishing compositions.

| Average Particle Diameter (Nanometers, nm) | Relative Amount of Boric Acid (R, unitless) | % Surface Modification* |
|---|---|---|
| 12 | 8.0 | 92 |
| 23 | 6.0 | 95 |
| 50 | 4.3 | 98 |
| 100 | 2.0 | 99 |

R = 100 × (moles of boric acid)/(moles of silica)
*Approximate values.

Analytical method for measuring the surface coverage of surface modified silica The amount of surface coverage of boric acid on the silica surface was measured using a Colloidal Dynamics instrument, manufactured by Colloidal Dynamics Corporation, 11-Knight Street, Building E8, Warwick, R.I., 02886. The Colloidal Dynamics instrument measures the zeta potential (surface charge) of the surface modified silica particles. During the preparation of boric acid modified silica, boric acid is added to the de-ionized silica particles, the addition of boric acid changes the zeta potential of the silica particle surface. After reaching the full surface coverage, there is no change in the zeta potential of the surface modified silica. From this titration curve of zeta potential as a function of gram of boric acid to a given amount of silica, we measured % surface coverage of boric acid on the silica surface.

EXAMPLE 1

This example gives the preparation of boron surface-modified colloidal silica starting with colloidal silica particles having an average particle diameter of 40 to 55 nanometers.

Approximately 1 kg of Amberlite® IR-120 ion exchange resin (Rohm and Haas Company, Philadelphia, Pa.) was washed with 1 liter of 20% sulfuric acid solution. The mixture was stirred and the resin was allowed to settle. The aqueous layer was decanted and washed with 10 liters of deionized water. The mixture was again allowed to settle and then the aqueous layer was decanted. This procedure was repeated until the decanted water was colorless. This procedure afforded acid-state resin.

Syton® HT-50 (12 kg, approximately 2.27 gallons, DuPont Air Products NanoMaterials LLC, Carlsbad, Calif.) was placed in a 5 gallon mix tank equipped with an agitator. 2.502 kg of deionized water was added to the tank and the solution was allowed to mix a few minutes. The pH of the solution was measured to be approximately 10.2. With continued pH monitoring, small amounts of acid-state resin were added, while allowing the pH to stabilize in between additions. Additional resin was added in small portions until the pH had dropped to pH 1.90–2.20. Once this pH limit had been reached and was stable in this range, no further resin additions were made and the mixture was stirred for 1–1.5 hours. Subsequently the mixture was passed through a 500-mesh screen to remove the resin and afforded deionized Syton® HT-50.

A solution of 268 g of boric acid powder (Fisher Scientific, 2000 Park Lane, Pittsburgh, Pa., 15275) in 5.55 kg of deionized water was prepared in a 10 gallon mixing tank equipped with an agitator and a heater by slowly adding the boric acid powder until all had been added to the water and then agitating the mixture for 15 hours and increasing the temperature of the mixture to 55–65° C. Deionized, and diluted Syton® HT-50 (14.5 kg) was then added to the boric acid solution slowly over about 1.2 hours by adding it at approximately 200 ml/minute and maintaining the temperature greater than 52° C. while agitating the mixture. After this addition was completed, heating at 60° C. and agitation of the mixture was continued for 5.5 hours. The resulting solution was subsequently filtered through a 1-micron filter to afford boron surface-modified colloidal silica.

This boron surface-modified colloidal silica was characterized for colloid stability over 15 days using a Colloidal Dynamics instrument (11-Knight Street, Building E8, Warwick, R.I., 02886). This boron surface-modified colloidal silica was found to exhibit both constant pH (pH=~6.6) and zeta potential (zeta potential=~−58 millivolts) over the 15-day test period. The percentage of surface sites of this surface-modified colloidal silica occupied by boron-containing compound(s) was approximately 98%.

EXAMPLE 2

This example illustrates that boron surface-modified colloidal silica is stable towards gel formation in the presence of a wide variety of different acids.

Boron surface-modified colloidal silica (20.3 Kg, prepared according to Example 1) was stirred at ambient temperature with 26.4 grams of 86 percent phosphoric acid ($H_3PO_4$) solution over 2 hours with periodic checks of the mixture (pH=2.4) for gel formation. No gel formation was observed over 30 days.

The above stability experiment towards gel formation was repeated in turn with each of the additional acids used in place of phosphoric acid (as listed above) that are shown in Table 1. For each acid, there was no observed gel formation over 30 days in acidic mixtures having pHs in the range 2.4–3.5 as shown for the specific acids listed in Table 1.

COMPARATIVE EXAMPLE 1

This example illustrates that commercial sodium-stabilized colloidal silica (not deionized and not surface-modified with a boron compound) is not stable towards gel formation in certain acidic media.

Syton® HT-50 colloidal silica (100 grams, DuPont Air Products NanoMaterials LLC, Carlsbad, Calif.) was stirred at ambient temperature with 6.3 grams of 30% periodic acid ($H_3IO_5$) solution. The mixture (pH=3.0) was observed to undergo gel formation after 15 hours of stirring at ambient temperature as indicated in Table 1. When phosphoric acid was used in place of periodic acid, gel formation occurred with 6 hours as indicated in Table 1. Results for some other acids that did not exhibit gel formation over 15 hours are also shown in Table 1.

COMPARATIVE EXAMPLE 2

This example illustrates that deionized colloidal silica in the acid form (as silicic acid) is not stable towards gel formation in certain acidic media.

Deionized Syton® HT-50 (150 grams, prepared as given in Example 1) was stirred at ambient temperature in one case with 0.10 gram of 30% periodic acid ($H_3IO_5$) solution and in a second case with 0.10 gram of 30% phosphoric acid ($H_3PO_4$). In both cases, the mixtures (pH=3.0) were observed to undergo gel formation after 10 days of stirring at ambient temperature. Results for some other acids that did not exhibit gel formation over 10 days are also shown in Table 1.

COMPARATIVE EXAMPLE 3

This example illustrates the preparation and testing of an aluminum surface-modified colloidal silica, which is not stable towards gel and floc formation in an acidic medium.

Aluminum surface-modified colloidal silica was prepared using the following procedure. Deionized water (10,507 grams) and basic aluminum acetate (boric acid stabilized, 1,284 grams, 35.3 weight % alumina equivalent) (Aldrich Chemicals, Milwaukee, Wis.) were combined in a dry mixing vessel (holding approx. 12–15 gallons) that was equipped with high shear agitation means. The mixture was agitated until all solids were completely dissolved affording reaction mixture A.

In a separate clean, dry vessel, deionized water (10,663 grams) and Syton® HT-50 (22,687 grams, approximately 4.31 gallons, DuPont Air Products NanoMaterials LLC, Carlsbad, Calif.) were combined with moderate agitation and mixed thoroughly. With moderate agitation at ambient temperature and with continual pH monitoring, spoonfuls of IRC-120 ion exchange resin (approximately 3,907 grams, (Aldrich Chemicals, Milwaukee, Wis.)) were added to this resulting mixture. After each resin batch addition, the reaction mass pH was allowed to stabilize for several minutes. Additional resin batch additions were made until a pH level of 2.00+−0.05 was reached. Soon after attaining the target pH of 2, the reaction mixture was filtered to remove the resin beads and affording reaction mixture B.

With high shear agitation and at ambient temperature, reaction mixture B was added to reaction mixture A at a constant rate over a 1-hour period. Once addition was completed, the high shear agitation was continued for 30 minutes affording the aluminum-modified colloidal silica.

Aluminum surface-modified colloidal silica (100 grams) was stirred at ambient temperature in a first case with 12.84 grams of 30% periodic acid ($H_3IO_5$) solution, in a second case with 9.83 grams of 20% phosphoric acid ($H_3PO_4$), and in a third case with 9.83 grams of 20% sulfuric acid ($H_2SO_4$). In all cases, the mixtures were observed to undergo gel and floc formation within 10–60 minutes of stirring at ambient temperature as indicated in Table 1. Results for nitric acid (HNO3) that did not exhibit gel formation over 30 days are also shown in Table 1.

TABLE 1

The influence of acid on the viscosity and zeta potential of boron surface-modified and aluminum surface-modified colloidal silica at pH 3.0

| Acid | Boron surface-modified colloidal silica | | | Sodium-stabilized colloidal Silica (not surface-modified) | | | Silicic acid (not surface-modified) | | | Aluminium surface-modified colloidal silica | | |
|---|---|---|---|---|---|---|---|---|---|---|---|---|
| | Amount added (g) | Viscosity (cP) | Zeta (mV) | Amount added (g) | Viscosity (cP) | Zeta (mV) | Amount added (g) | Viscosity (cP) | Zeta (mV) | Amount added (g) | Viscosity (cP) | Zeta (mV) |
| None - Base Colloid | — | 2.15 | −53.6 | — | 6.22 | −92.7 | — | 3.72 | 0.5 | — | 2.01 | 33.3 |
| 20% H3PO4 | 1.01 | 2.08 | −17.9 | 3.5 | 3.34(gel after 6 hr) | −1.1 | 1.4 | 3.27(gel-after 10 days) | −2.2 | 9.83 | Gel | — |
| 30% HIO4 | 1.31 | 2.22 | −16.9 | 4.57 | 3.58(gel after 15 hr) | −1.7 | 1.83 | 3.21(gel-after 10 days) | −1.8 | 12.84 | Gel after 10 min | — |
| 20% HNO3 | 0.65 | 2.16 | −29.6 | 2.25 | 3.23 | −56 | 0.9 | 3.52 | −1.4 | 6.32 | 1.99 | 28 |
| 20% H2SO4 | 1.01 | 2.20 | −16.1 | 3.5 | 2.81 | −0.51 | 1.4 | 3.19 | −2.1 | 9.83 | Gel after 30 min | 6.1 |

Notes: Different ratios of acid to silica were used as required for the abrasive materials listed above in order to adjust pH to 3.0 for each case.
The amount of abrasive material used in each formulation shown in this table was 180 grams.
cP = centipoises(s)
Zeta = zeta potential
g = gram(s)
hr = hour(s)
min = minute(s)
mV = millivolt(s)

EXAMPLE 3

This example illustrates the preparation and testing of boron surface-modified colloidal titania to establish that this material is gel-free in an acidic medium.

Boric acid treatment of colloidal fumed-titania (Degussa Corporation, 65-Challanger Road, Ridgefield Park, N.J., 07660) to afford boron surface-modified colloidal titania was done according to the procedure given in Example 1 except that 100 grams of colloidal fumed-titania was used in place of the colloidal silica. The percentage of surface sites of the resulting surface-modified colloidal titania occupied by boron-containing compound(s) was approximately 98%.

Portions of the resulting boric acid surface-modified colloidal titania (100 grams) were stirred at ambient temperature in the presence of one of the acids (phosphoric acid, periodic acid, nitric acid, or sulfuric acid) as listed in Table 2 selected in turn sequentially. In Table 2, zeta potential, pH, conductivity, and comparisons with boric acid surface-modified colloidal silica are shown. None of the samples was observed to have any gel or floc formed over 3 days.

TABLE 2

Boric Acid-Modified Cerium dioxide (Ceria), Titanium dioxide (Titania) and Silicon dioxide (Silica) Particles

| Sample | $H_3BO_3$-modified $CeO_2$ | $H_3BO_3$-modified ***$TiO_2$ | $H_3BO_3$-modified $SiO_2$ |
|---|---|---|---|
| Solids (Weight %) | 8.72 | 4.68 | 24.92 |
| pH | 7.13 | 3.01 | 5.91 |
| Zeta Potential (mV) | −42.6 | 162.4 | −51 |
| Conductivity (S/m) | 0.1115 | 0.015 | 0.1092 | mV = Millivolt(s)
S/m = Sieman/meter
***high positive zeta potential due to some particle agglomeration

EXAMPLE 4

This example illustrates the preparation and testing of boron surface-modified colloidal ceria to establish that this material is gel-free in an acidic medium.

Boric acid treatment of colloidal ceria (Saint-Gobain,1-New Bound Street, P.O.Box 15137, Worcester, Mass., 01615) to afford boron surface-modified colloidal ceria was done according to the procedure given in Example 1 except that 100 grams of colloidal ceria were used in place of colloidal silica. The percentage of surface sites of the surface-modified colloidal ceria occupied by boron-containing compound(s) was approximately 95%.

Portions of the resulting boric acid surface-modified colloidal ceria (100 grams) were stirred at ambient temperature in the presence of one of the following acids selected in turn sequentially: nitric acid, phosphoric acid, sulfuric acid, and periodic acid. In Table 2, zeta potential, pH, conductivity, and comparisons with boric acid surface-modified colloidal silica are shown for these acid and surface-modified colloidal ceria compositions. None of the resulting samples was observed to have any gel or floc formed over 3 days.

EXAMPLE 5

This example illustrates that a polishing composition comprised of boron surface-modified colloidal silica was found to be effective for chemical mechanical planarization (CMP) of a surface of a substrate containing areas of tungsten metal and a dielectric (i.e., PETEOS, plasma enhanced tetraethyl orthosilicate) with high selectivity for removal of tungsten relative to the dielectric.

A four kilogram batch of the following polishing composition was prepared:

| Component | Amount (grams) |
|---|---|
| Boron surface-modified colloidal silica (as prepared in Example 1) | 154 |
| Periodic acid (30% aqueous solution) | 346 |
| Renex ® 690 Nonionic Surfactant (10% solution, Imperial Chemical Industries, Ltd., Wilmington, DE) | 45 |
| Water | 3,373 |
| Ammonium hydroxide | Approximately 82 g as necessary to adjust mixture pH to 3.5–4 |

The above polishing composition was used to polish the surface of a substrate as described above. An IPEC 372, SpeedFam-IPEC, 305 North 54$^{th}$ street, Chandler, Ariz., 85226, polishing machine was used with conditions set as follows:

Down force=7 psi (pounds per square inch)

Flow rate of polishing composition=170 ml/min (milliliters per minute)

Back pressure=0.5 psi

Carrier speed=35 psi

Platen speed=40 revolutions per minute (RPM)

The substrate was effectively planarized using the above polishing composition under the stated conditions with 20:1 selectivity for tungsten removal relative to PETEOS removal.

PROPHETIC COMPARATIVE EXAMPLE 4

This prophetic comparative example will illustrate that either sodium-stabilized colloidal silica (e.g., Syton® HT-50) or silicic acid (deionized colloidal silica in the acid form; e.g., deionized Syton® HT-50), both of which are not boron surface-modified compositions, are ineffective and afford poor results when used in place of boron surface-modified colloidal silica in the composition for tungsten CMP given in Example 5. More specifically, when either sodium-stabilized colloidal silica or silicic acid is used in an equal amount by weight in place of the boric acid surface-modified colloidal silica of Example 5 in polishing compositions with all other components being the same, these comparative compositions will be shown to be ineffective and afford poor results for use as compositions for tungsten CMP, primarily because these non boron surface-modified compositions are not stable in acidic media such as periodic acid media with respect to gel formation and phase separation.

The present invention has been set forth with reference to several preferred embodiments, but the full scope of the present invention should be ascertained from the claims, which follow.

What is claimed is:

1. A composition for chemical-mechanical planarization comprising:

A) a boron surface-modified colloidal abrasive containing a boron compound on the surface of the abrasive, wherein the boron compound is present on the surface of the abrasive at a level of at least 20 percent of available surface sites; and B) an acid.

2. A composition for chemical-mechanical planarization comprising:

A) a boron surface-modified colloidal abrasive containing a boron compound on the surface of the abrasive, wherein the abrasive is selected from the group consisting of colloidal ceria and colloidal titania; and B) an acid.

3. The composition of claim 1 or claim 2 wherein the acid is an oxidizing acid.

4. The composition of claim 3 wherein the oxidizing acid is periodic acid.

5. The composition of claim 1 or claim 2 further comprising an oxidizing agent.

6. The composition of claim 1 or claim 2 wherein the boron compound is boric acid.

7. A method of chemical-mechanical planarization comprising the steps of:

A) placing a substrate in contact with a polishing pad;

B) delivering a composition comprising:

a) a boron surface-modified colloidal abrasive containing a boron compound on the surface of the abrasive, wherein the boron compound is present on the surface of the abrasive at a level of at least 20 percent of available surface sites; and b) an acid; and C) at least partially planarizing the substrate with the composition.

8. The method of claim 7 wherein the abrasive is silica.

9. A method of chemical-mechanical planarization comprising the steps of:

A) placing a substrate in contact with a polishing pad;

B) delivering a composition comprising:

a) a boron surface-modified colloidal abrasive containing a boron compound on the surface of the abrasive, wherein the abrasive is selected from the group consisting of colloidal ceria and colloidal titania; and b) an acid; and C) at least partially planarizing the substrate with the composition.

10. The method of claim 7 or claim 9 wherein the acid is an oxidizing acid.

11. The method of claim 10 wherein the oxidizing acid is periodic acid.

12. The method of claim 7 or claim 9 wherein the composition further comprises an oxidizing agent.

13. The method of claim 7 or claim 9 wherein the boron compound is boric acid.

* * * * *